United States Patent
Yamanobe et al.

(10) Patent No.: US 6,521,838 B2
(45) Date of Patent: Feb. 18, 2003

(54) HEAT-RESISTANT, FLEX-RESISTANT FLEXIBLE FLAT CABLE AND PROCESS FOR PRODUCING THE SAME

(75) Inventors: Hiroshi Yamanobe, Ibaraki (JP); Takaaki Ichikawa, Ibaraki (JP); Seigi Aoyama, Ibaraki (JP); Tsutomu Komori, Ibaraki (JP); Masato Ito, Ibaraki (JP); Katsuo Endo, Ibaraki (JP); Noboru Nakakuki, Ibaraki (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 09/910,954

(22) Filed: Jul. 24, 2001

(65) Prior Publication Data

US 2002/0170740 A1 Nov. 21, 2002

(30) Foreign Application Priority Data

Mar. 30, 2001 (JP) ........................................ 2001-099620

(51) Int. Cl.[7] ................................................. H01B 7/00
(52) U.S. Cl. .............................. 174/117 F; 174/117 FF; 174/117 A
(58) Field of Search ........................ 174/110 R, 113 R, 174/117 A, 117 F, 117 FF

(56) References Cited

U.S. PATENT DOCUMENTS

| 3,612,743 A | * 10/1971 | Angele ................... 174/106 R |
| 4,098,628 A | * 7/1978 | Walton ........................ 156/52 |

FOREIGN PATENT DOCUMENTS

| JP | 7-331199 A | * 12/1995 | ........... H01B/13/00 |
| JP | 8-161938 A | * 6/1996 | ............ H01B/7/08 |

* cited by examiner

*Primary Examiner*—Anthony Dinkins
*Assistant Examiner*—William H. Mayo, III
(74) *Attorney, Agent, or Firm*—Foley & Lardner

(57) ABSTRACT

A flexible flat cable has a single conductor or a plurality of conductors, juxtaposed to each other or one another, which are sandwiched between a pair of plastic films with an adhesive to form an integral structure. The plastic films with an adhesive have a modulus of longitudinal elasticity of not less than 300 kg/mm$^2$ and an elongation of not less than 20%. The plastic films are formed of a polyimide. The adhesive is formed of an epoxy having a glass transition temperature Tg of 80° C. or above, and the 180° peel strength between the adhesive and the single conductor or the plurality of conductors is not less than 0.5 kg/cm.

5 Claims, 1 Drawing Sheet

HEAT-RESISTANT, FLEX-RESISTANT FLEXIBLE FLAT CABLE AND PROCESS FOR PRODUCING THE SAME

FIELD OF THE INVENTION

The invention relates to a flat cable extensively used in various types of electric and electronic equipment, such as audio/visual (AV) equipment and office automation (OA) equipment, and more particularly to a flexible flat cable (FFC) having excellent flex resistance and heat resistance.

BACKGROUND OF THE INVENTION

Flat cables (FCs), which have hitherto been used as circuit-to-circuit jumper wires (fixation wires) or the like in various types of electric and electronic equipment, are multi-core strip-type electric wires comprising several to ten-odd conductors which have been integrally covered with an insulating cover. By virtue of particularly excellent flexibility (flex resistance), in recent years, the flat cables have become more and more applied as an alternative to flexible printed wiring boards (FPC) which have been used as a wiring material in movable parts of AV equipment, OA equipment and the like.

For example, in 0.1 to 0.3 mm-thick flexible flat cables (FFCs) using a pure tin or solder plated flat-type conductor (a pure copper system (for example, TPC)), the use of the FFCs, for example, in photo-pickup wiring of CD players for music and CD-ROM of personal computers and car navigation systems has been rapidly increased from the viewpoint of reducing prices. Further, in recent years, the development and mass production of high-density FFCs of 22 $\mu$m in conductor thickness×0.5 mm in pitch have been realized, and these FFCs have become applied to the latest electronic equipment, for example, photo-pickup wiring of DVDs (digital versatile discs).

A tendency of CDs and DVDs toward higher performance and higher compactness has lead to a fear that the internal temperature reaches 60° C. and, in some products, up to 80° C. To cope with this, excellent flex resistance at high temperatures as well as room temperature is required of flexible flat cables used in these applications.

In most of the conventional flexible flat cables, PET (polyethylene terephthalate) is used as an insulating cover (a plastic film), and polyester is used as an adhesive. Due to this constitution, the flex resistance at 60° C. is lowered to about 20% or less of the flex resistance at room temperature. Therefore, at the present time, the conventional flexible flat cables are not used in all CDs, DVDs and the like.

SUMMARY OF THE INVENTION

The invention has been made with a view to solving the above problems of the prior art, and it is an object of the invention to provide a novel flexible flat cable having a combination of excellent flex resistance and heat resistance, and a process for producing the same.

According to the first feature of the invention, a heat-resistant, flex-resistant flexible flat cable comprises: a single tin or solder plated conductor or a plurality of tin or solder plated conductors juxtaposed to each other or one another; and a pair of plastic films with an adhesive, said single conductor or said plurality of conductors having been sandwiched between the pair of plastic films with an adhesive to form an integral structure, said plastic films with an adhesive being formed of a polyimide with an adhesive which has a modulus of longitudinal elasticity of not less than 300 kg/mm$^2$ and an elongation of not less than 20%, said adhesive being formed of an epoxy having a glass transition temperature Tg of 80° C. or above, the 180° peel strength between the adhesive and the conductor being not less than 0.5 kg/cm.

According to this constitution, the flat cable has significantly improved heat resistance, and can exhibit excellent flex resistance even at a high temperature of 80° C. or above.

In this flat cable, the epoxy constituting the adhesive is preferably cured at a temperature of 100° C. or below. This can prevent a lowering in strength of the conductor, which adversely affects the flexibility, and the diffusion of plating ingredients into the epoxy during the step of curing.

According to the second feature of the invention, a process for producing the heat-resistant, flex-resistant flexible flat cable according to the first feature of the invention, comprises the steps of:

sandwiching and temporarily applying a single conductor or a plurality of conductors between the pair of plastic films with an adhesive having the above properties by means of a hot roll; and then heating the laminate in a heating oven at a temperature of 100° C. or below for several hours to several tens of hours to cure the adhesive.

According to this constitution, the flexible flat cable having excellent heat resistance and flex resistance can be easily produced.

BRIEF DESCRIPTION OF THE DRAWINGS

The invention will be explained in more detail in conjunction with the appended drawings, wherein.

DESCRIPTION OF THE PREFERRED EMBODIMENTS

Preferred embodiments of the invention will be explained in conjunction with the accompanying drawings.

Figure 1:
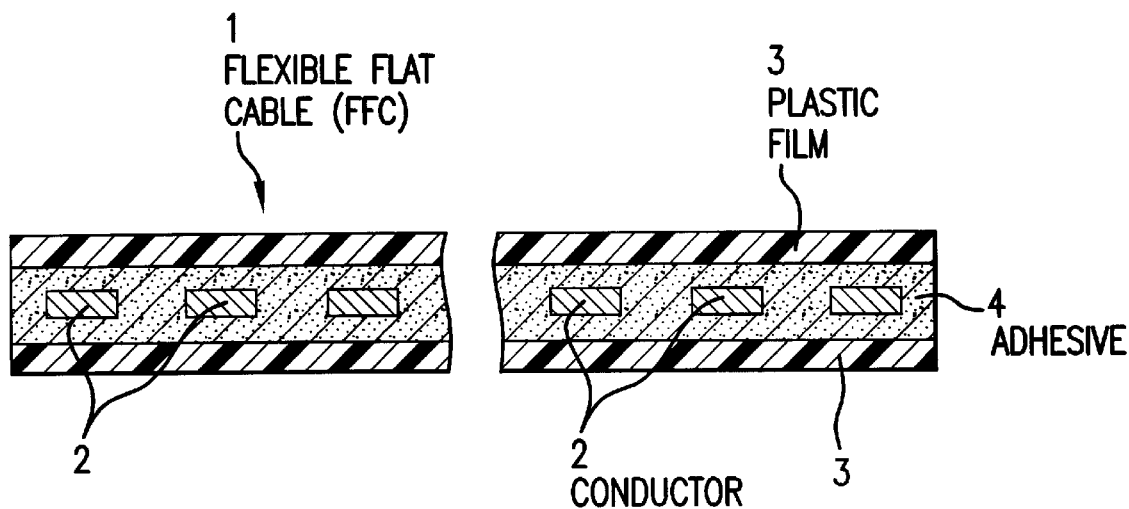
FIG. 1 is an enlarged cross-sectional view showing a referred embodiment of the heat-resistant, flex-resistant flexible flat cable according to the invention.

FIG. 1 is an enlarged cross-sectional view showing a preferred embodiment of the heat-resistant, flex-resistant flexible flat cable (hereinafter abbreviated to as "FFC") according to the invention.

As shown in FIG. 1, FFC 1 comprises several to ten-odd pure tin or solder plated flat-type conductors 2, 2 . . . , juxtaposed to one another, which have been sandwiched between a pair of plastic films 3, 3 with an adhesive so as to be embedded in the adhesive 4 to form an integral structure.

In this case, the plastic films 3, 3 with an adhesive each are formed of a polyimide (Pi) with an adhesive which has mechanical properties of a modulus of longitudinal elasticity of not less than 300 kg/mm$^2$ and an elongation of not less than 20%, and the adhesive 4 is formed of an epoxy having a glass transition temperature Tg of 80° C. or above and a curing temperature of 105° C. or below. Further, the 180° peel strength between the adhesive 4 and the conductor 2 is not less than 0.5 kg/cm. By virtue of this constitution, as is demonstrated in the working examples described later, excellent flex resistance and heat resistance can be simultaneously realized.

Even though polyimide is used, instead of PET as the conventional material, as the material for the plastic films 3, 3 with an adhesive and, at the same time, epoxy is used, instead of polyester, as the adhesive, as is apparent from the working examples described later, a failure to meet any one of the above requirements poses a problem that, although the flex resistance is excellent at a relatively low temperature, the flex resistance significantly lowers with raising the temperature.

The epoxy used as the adhesive 4 is preferably cured at a temperature of 100° C. or below. This can prevent, during the step of curing, a lowering in strength of the conductor, which adversely affects the flexibility, and the diffusion of plating ingredients into the epoxy.

The heat-resistant, flex-resistant flexible flat cable 1 of the invention having the above properties can be produced as follows. Continuously supplied conductors 2, 2 . . . are sandwiched, from the upper and lower sides thereof, between plastic films 3, 3 with an adhesive by hot rolling to temporarily apply the conductors 2, 2 . . . between the plastic films 3, 3 with an adhesive. The laminate is then fed, for example, into a heating oven where, in order to prevent a lowering in strength of the conductor 2, which adversely affects the flexibility, during the step of curing, the laminate is heated at a temperature of 100° C. or below for several hours to ten-odd hours to cure the adhesive 4.

EXAMPLES

The invention will be explained in more detail with reference to the following examples and comparative examples.

Example 1

At the outset, a pair of films with an adhesive (Pi 25 μm/epoxy 30 μm; modulus of longitudinal elasticity 309 kg/mm$^2$, elongation 24%), each comprising a 25 μm-thick polyimide film and an adhesive of an epoxy having a Tg temperature of 105° C. provided on one side of the film, were provided. Conductors of solder plated flat-type TPC wires (0.035 mm in thickness×0.7 mm in width, plating thickness 1.5 μm) were sandwiched between the pair of films with an adhesive to form an integral structure. Thus, FFC (145 μm in thickness×15 mm in width, conductor-to-conductor pitch 1.0 mm, adhesive thickness 30 μm, 14 cores, 180-degree peel strength between adhesive and conductor 0.7 kg/cm) was prepared. The flex life of the FFC was then evaluated on three levels of temperatures (23° C., 60° C., 80° C.). The results are shown in Table 1 below.

Figure 2:
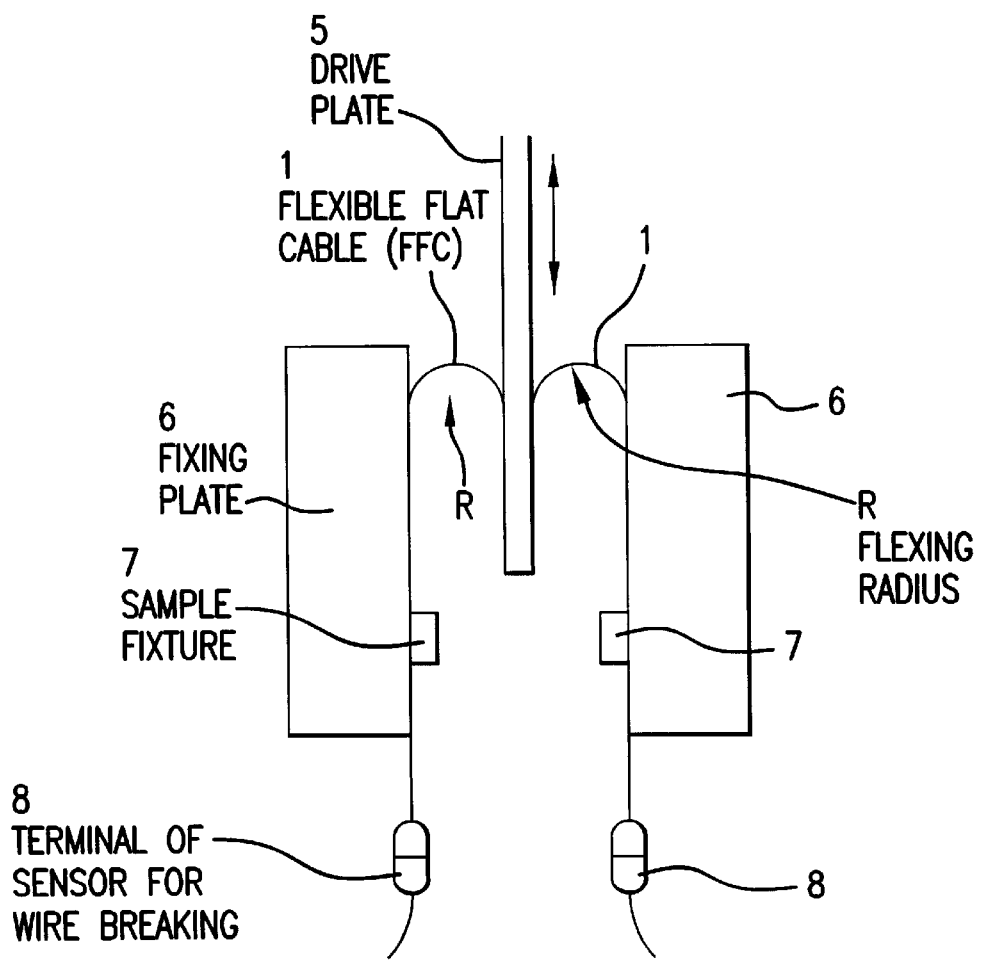
FIG. 2 is a diagram illustrating a flex life evaluation method adopted in the preferred embodiment shown in FIG. 1.

Here the flex life was measured by a method shown in FIG. 2. Specifically, a pair of FFCs 1, 1 prepared above each are flexed in a U form (flexing radius 3.5 mm), and one end of each FFC is fixed to a fixation plate 6 by means of a sample fixture 7 while the other end is fixed onto a drive plate 5, followed by vertical reciprocation (1500 times/min) of the drive plate 5 at a constant stroke (25 mm) to measure the number of times of reciprocation necessary for causing the breaking of the conductor. The breaking was detected as follows. A terminal 8 of a wire breaking sensor was connected to the terminal fixed on the fixation plate 6 side, and the breaking was judged in terms of the number of times of the stop of a conductor energization current for a monitor for not less than 10$^{-6}$ sec or the number of times of an increase in conductor resistance by 10% from the initial conductor resistance. The modulus of longitudinal elasticity of the plastic film with an adhesive, which greatly varies depending upon measuring conditions, was measured by means of a tensile tester under conditions of gauge length 30 mm, sample width 10 mm, and tensile speed 4 mm/min.

Example 2

FFC was prepared in the same manner as in Example 1, except that the adhesive was an epoxy having a Tg temperature of 93° C., the film with an adhesive had a modulus of longitudinal elasticity of 318 kg/mm$^2$ and an elongation of 35%, and the 180-degree peel strength between the adhesive and the conductor was 0.5 kg/cm. For the FFC, the flex life was then evaluated in the same manner as in Example 1.

Comparative Examples 1 to 4

Four types of FFCs were prepared in the same manner as in Example 1, except that the Tg temperature, the modulus of longitudinal elasticity, and the 180-degree peel strength between the adhesive and the conductor were different, as indicated in the column of comparative example shown in Table 1 below, from those in Example 1. For the FFCs, the flex life was then evaluated in the same manner as in Example 1.

Comparative Examples 5 to 7

Three types of FFCs were prepared in the same manner as in Example 1, except that PET, which has been used in the conventional film, was used as the material for the plastic film with an adhesive, and the adhesive was of a polyester type. For the FFCs, the flex life was then evaluated in the same manner as in Example 1.

TABLE 1

| | Properties of FFC | | | | | | | | |
| | Ex. (Invention) | | Comp. Ex. | | | | | | |
| | 1 | 2 | 1 | 2 | 3 | 4 | 5 | 6 | 7 |
| | | | | | Material of film | | | | |
| | Pi | Pi | Pi | Pi | Pi | Pi | PET | PET | PET |
| Adhesive | | | | | | | | | |
| Material | Epoxy ① | Epoxy ② | Epoxy ① | Expoxy ③ | Epoxy ④ | Epoxy ⑤ | Epoxy ② | Poly-ester ① | Poly-ester ② |
| Tg temp., ° C. Film with adhesive | 105 | 93 | 105 | 73 | 48 | 102 | 93 | 51 | 23 |

TABLE 1-continued

| | Properties of FFC | | | | | | | | |
|---|---|---|---|---|---|---|---|---|---|
| | Ex. (Invention) | | Comp. Ex. | | | | | | |
| | 1 | 2 | 1 | 2 | 3 | 4 | 5 | 6 | 7 |
| | | | | | Material of film | | | | |
| | Pi | Pi | Pi | Pi | Pi | Pi | PET | PET | PET |
| Modulus of longitudinal elasticity, kg/mm$^2$ | 309 | 318 | 306 | 380 | 273 | 315 | 287 | 219 | 205 |
| Elongation, % | 24 | 35 | 15 | 42 | 21 | 41 | 67 | 113 | 128 |
| 180-Degree peel strength between adhesive and conductor, kg/cm | 0.7 | 0.5 | 0.7 | 1.2 | 1.1 | 0.3 | 0.5 | 1.3 | 1.3 |
| Flex life of FFC, × 10$^4$ times R = 3.5 mm | | | | | | | | | |
| 23° C. | Not less than 1000 | Not less than 1000 | 868 | Not less than 1000 | 372 | 311 | 597 | 448 | 136 |
| 60° C. | Not less than 1000 | Not less than 1000 | 619 | Not less than 1000 | 90 | 252 | 187 | 85 | 35 |
| 80° C. | Not less than 1000 | Not less than 1000 | 383 | 685 | 34 | 83 | 38 | 28 | 16 |

*: The modulus of longitudinal elasticity of the film with an adhesive is a value which has been rounded off to the decimal point.
**: The flex life is a value which has been rounded off to the 10$^4$ times.

As is apparent from Table 1, FFCs prepared in Examples 1 and 2 according to the invention had a flex life of not less than 10000000 times at all the test temperatures and had excellent flex resistance and heat resistance.

By contrast, for Comparative Example 1 wherein the elongation of the film with an adhesive was low (15%), the flex life did not reach 10000000 times at all the test temperatures, and the flex resistance significantly deteriorated with increasing the temperature. For Comparative Example 2 wherein the Tg temperature of the adhesive was 80° C. or below (73° C.), although the flex life at 23° C. and the flex life at 60° C. were excellent and comparable to those in Example 1, the flex life rapidly lowered at 80° C. indicating poor heat resistance. For both Comparative Example 3 wherein both the Tg temperature of the adhesive and the modulus of longitudinal elasticity of the film with an adhesive were below the lower limits of these parameters specified in the invention and Comparative Example 4 wherein the 180-degree peel strength between the adhesive and the conductor was 0.3 and was below the lower limit of the peel strength specified in the invention, the flex life was significantly lowered, at all the test temperatures, to one-third of or by a greater extent from the values attained in the examples.

For Comparative Example 5 wherein PET was used as the film material, despite the fact that the Tg temperature, the modulus of longitudinal elasticity and the like were equal to or more than those in the examples of the invention, the flex life was here again inferior at all the test temperatures. For Comparative Examples 6 and 7 wherein PET was used as the film material and the adhesive was of a polyester type, the Tg temperature was much below the lower limit of the Tg temperature specified in the invention and the flex life was significantly inferior at all the test temperatures.

The invention is not limited to the above examples. Specifically, the thickness of the film with an adhesive may be further reduced (for example, Pi 12.5 μm, epoxy 20 μm), and the thickness of the conductor may be reduced to 17.5 μm. In this case, even under severer conditions (R=2 mm), a flex life of not less than 10000000 times could be achieved at 80° C.

According to the invention, a combination of a Pi thickness of not more than 50 μm, preferably not more than 25 μm, an epoxy adhesive thickness of not more than 50 μm, preferably not more than 35 μm, and a conductor thickness of not more than 50 μm, preferably not more than 35 μm, is preferred. This combination can realize higher flex resistance.

In summary, according to the invention, a flexible flat cable can be realized which has significantly improved heat resistance and, at the same time, has excellent flex resistance even at a high temperature of 80° C. or above. Therefore, advantageously, the flexible flat cable according to the invention can be easily and surely applied, for example, as wiring materials in moving parts of high-performance, compact electric and electronic equipment, such as CDs and DVDs, to which conventional FFCs could not have been applied without difficulties.

The invention has been described in detail with particular reference to preferred embodiments, but it will be understood that variations and modifications can be effected within the scope of the invention as set forth in the appended claims.

What is claimed is:

1. A heat-resistant, flex-resistant flexible flat cable comprising: a single tin or solder plated conductor or a plurality of tin or solder plated conductors juxtaposed to each other or one another; a pair of plastic films; and an adhesive, said single conductor or said plurality of conductors having been sandwiched between the pair of plastic films with the adhesive to form an integral structure, said plastic films with the adhesive having a modulus of longitudinal elasticity of not less than 300 kg/mm$^2$ and an elongation of not less than 20%, said plastic films being formed of a polyimide, said adhesive being formed of au epoxy having a glass transition temperature Tg of 80° C. or above, wherein the epoxy constituting the adhesive is cured at a temperature of 100° C. or below, and a 180° peel strength between the adhesive and the single conductor or the plurality of conductors being not less than 0.5 kg/cm.

2. A process for producing the heat-resistant, flex-resistant flexible flat cable according to claim 1, comprising the steps of:

sandwiching and temporarily applying a single conductor or a plurality of conductors between the pair of plastic films with an adhesive having the properties as defined in claim 1 by a hot roll; and then heating the pair of plastic films and single conductors or the plurality of conductors and the adhesive in a heating oven at a temperature of 100° C. or below for several hours to several tens of hours to cure the adhesive.

3. The cable according to claim 1, wherein a thickness of said pair of plastic films is approximately 50 μm or less, a thickness of said adhesive is approximately 50 μm or less, and a thickness of said single conductor or said plurality of conductors is approximately 50 μm or less.

4. The cable according to claim 1, wherein a thickness of said pair of plastic films is approximately 25 μm or less, a thickness of said adhesive is approximately 35 μm or less, and a thickness of said single conductor or said plurality of conductors is approximately 35 μm or less.

5. A heat-resistant, flex-resistant flexible flat cable comprising: a single tin or solder plated conductor or a plurality of tin or solder plated conductors juxtaposed to each other or one another; a pair of plastic films; and an adhesive, said single conductor or said plurality of conductors having been sandwiched between the pair of plastic films with the adhesive to form an integral structure, said plastic films with the adhesive having a modulus of longitudinal elasticity of not less than 300 kg/mm² and an elongation of not less than 20%, said plastic films being formed of a polyimide, said adhesive being formed of an epoxy having a glass transition temperature Tg of 80° C. or above, wherein the epoxy constituting the adhesive is cured at a temperature of 105° C. or below, and a 180° peel strength between the adhesive and the single conductor or the plurality of conductors being not less than 0.5 kg/cm.

* * * * *